United States Patent
Holma et al.

(10) Patent No.: US 9,267,981 B2
(45) Date of Patent: *Feb. 23, 2016

(54) EQUIPMENT PROVIDED WITH ONE OR MORE PLUG-IN UNITS

(71) Applicant: TELLABS OY, Espoo (FI)

(72) Inventors: Antti Holma, Espoo (FI); Heikki Laamanen, Espoo (FI); Petri Kohonen, Vantaa (FI); Ian Leiman, Espoo (FI)

(73) Assignee: CORIANT OY, Espoo (FI)

( * ) Notice: Subject to any disclaimer, the term of this patent is extended or adjusted under 35 U.S.C. 154(b) by 382 days.

This patent is subject to a terminal disclaimer.

(21) Appl. No.: 13/861,437

(22) Filed: Apr. 12, 2013

(65) Prior Publication Data
US 2013/0293238 A1 Nov. 7, 2013

(30) Foreign Application Priority Data
May 3, 2012 (FI) ..................................... 20125481

(51) Int. Cl.
*G01R 31/04* (2006.01)
*H05K 7/14* (2006.01)
*H05K 7/18* (2006.01)

(52) U.S. Cl.
CPC ............ *G01R 31/041* (2013.01); *H05K 7/1498* (2013.01); *H05K 7/186* (2013.01); *G01R 31/04* (2013.01); *G01R 31/043* (2013.01); *G01R 31/045* (2013.01); *G01R 31/046* (2013.01)

(58) Field of Classification Search
CPC .... G01R 31/04; G01R 31/041; G01R 31/043; G01R 31/045; G01R 31/046; H05K 7/14; H05K 7/1498; H05K 7/18; H05K 7/186

USPC ................................................... 324/508, 500
See application file for complete search history.

(56) References Cited

U.S. PATENT DOCUMENTS

| 4,843,514 A | * | 6/1989 | Bodkin | ........................... 361/50 |
| 5,712,569 A | * | 1/1998 | Canu et al. | .................... 324/538 |
| 7,400,152 B2 | * | 7/2008 | Thole et al. | .................... 324/537 |

(Continued)

FOREIGN PATENT DOCUMENTS

| EP | 2254397 | 11/2010 |
| JP | 9 329281 | 12/1997 |
| WO | 2010/042586 | 4/2010 |

OTHER PUBLICATIONS

Finnish Search Report dated Jan. 8, 2013, corresponding to the Foreign Priority Application No. 20125481.

*Primary Examiner* — Hoai-An D Nguyen
(74) *Attorney, Agent, or Firm* — Young & Thompson

(57) ABSTRACT

Equipment including at least one plug-in unit and a body device for receiving the plug-in unit is presented. The plug-in unit includes an electrically conductive structure (121, 122, 123) having at least one surface area capable of forming a capacitive coupling with a surface area of an electrically conductive part (130, 131) of the body device when the plug-in unit is inserted in the body device. The equipment further includes a monitoring circuit (124) for generating a signal indicative of electrical properties of a measurement circuit including the capacitive coupling and at least one galvanic contact provided by electrical connectors of the plug-in unit and the body device. The generated signal is also indicative of correctness of the installation of the plug-in unit. Thus, the correct installation of the plug-in unit can be electrically indicated and monitored.

20 Claims, 7 Drawing Sheets

(56) References Cited

U.S. PATENT DOCUMENTS

2010/0295561 A1* 11/2010 Matero .................. 324/662
2012/0081226 A1 4/2012 Hu
2013/0293239 A1* 11/2013 Holma et al. ............. 324/508

* cited by examiner

EQUIPMENT PROVIDED WITH ONE OR MORE PLUG-IN UNITS

FIELD OF THE INVENTION

The invention relates to equipment comprising one or more plug-in units and a body device for receiving the plug-in units. The equipment can be, for example but not necessarily, telecommunication equipment. Furthermore, the invention relates to a method for indicating correct installation of a plug-in unit.

BACKGROUND

In many cases it is advantageous that equipment is modular so that the equipment comprises a body device and plug-in units installed in the body device. The equipment can be, for example but not necessarily, telecommunication equipment such as an internet protocol "IP" router, an Ethernet switch, an Asynchronous Transfer Mode "ATM" switch, and/or a MultiProtocol Label Switching "MPLS" switch. A commonly used construction is such that the telecommunication equipment comprises a frame and plug-in units which are installed in plug-in unit slots of the frame. In this case, the frame represents a body device for receiving the plug-in units. Electrical connectors in a plug-in unit make galvanic contacts with corresponding electrical connectors in the frame when the plug-in unit is inserted in the plug-in unit slot of the frame. The frame may have wirings such that plug-in units installed in the frame form a full mesh network or such that plug-in units installed in the frame are connected to a central element which may comprise one or more plug-in units installed in the frame or which may be a functional component integrally built in the frame.

Care is needed in the installation of a plug-in unit in a body device because galvanic contacts between the electrical connectors of the plug-in unit and corresponding electrical connectors of the body device may be poor, or even non-existent, if the plug-in unit is not properly installed in its place. In one prior-art solution, pins of some poles in the electrical connectors between the plug-in unit and the body device are shorter than pins of other poles in these electrical connectors. These shorter pins are part of a test circuit for detecting whether the plug-in unit is installed in such a way that the shorter pins make galvanic contacts in the electrical connectors. If the shorter pins make the galvanic contacts, there is a good certainty that also the longer pins in the electrical connectors make adequate galvanic contacts. The above-described prior-art solution for indicating correct installation of a plug-in unit is suitable in cases where some poles of an electrical connector can be made such that galvanic contacts between these poles constitutes a sufficient guarantee of correct galvanic contacts between other poles of the electrical connector. In conjunction with some electrical connector structures this may be, however, challenging. Therefore, there is a need for other technical solutions for indicating correct installation of a plug-in unit.

SUMMARY

The following presents a simplified summary in order to provide a basic understanding of some aspects of various invention embodiments. The summary is not an extensive overview of the invention. It is neither intended to identify key or critical elements of the invention nor to delineate the scope of the invention. The following summary merely presents some concepts of the invention in a simplified form as a prelude to a more detailed description of exemplifying embodiments of the invention.

In accordance with the first aspect of the invention, there is provided new equipment that can be, for example but not necessarily, telecommunication equipment. The equipment according to the invention comprises:
- one or more plug-in units,
- a body device for receiving the one or more plug-in units, and
- electrical connectors in the one or more plug-in units and in the body device, the electrical connectors being suitable for providing galvanic contacts between each of the one or more plug-in units and the body device, wherein:
- at least one of the plug-in units comprises an electrically conductive structure having at least one surface area capable of forming a capacitive coupling with a surface area of an electrically conductive part of the body device when this plug-in unit is inserted in the body device, and
- the equipment further comprises a monitoring circuit for generating a signal indicative of electrical properties of a measurement circuit comprising the capacitive coupling and at least one galvanic contact provided by the electrical connectors.

The above-mentioned signal is also indicative of the correctness of the installation of the plug-in unit in the body device. The above-mentioned monitoring circuit can be located in this plug-in unit, in another plug-in unit, or in the body device. The electrically conductive structure of the plug-in unit and the electrically conductive part of the body device are preferably arranged so that, when the plug-in unit is moved with respect to the body device, the capacitive coupling is being changed and thus the impedance of the measurement circuit changes. Hence, the position of the plug-in unit can be indicated by measuring the electrical properties of the measurement circuit. As the measurement circuit comprises both the capacitive coupling and the at least one galvanic contact provided by the electrical connectors, the correct position of the plug-in unit and also the correct coupling of the electrical connectors can be electrically indicated and monitored.

In accordance with the second aspect of the invention, there is provided a new method for indicating correct installation of a plug-in unit in a body device. The method according to the invention comprises monitoring electrical properties of a measurement circuit comprising:
- at least one capacitive coupling between an electrically conductive structure of the plug-in unit and at least one conductive part of the body device, and
- at least one galvanic contact between the body device and one of plug-in units installed in the body device, The method further comprises generating a signal indicative of electrical properties of the measurement circuit. The signal is also indicative of correctness of the position of the plug-in unit forming the capacitive coupling and of correctness of the galvanic connection.

A number of non-limiting exemplifying embodiments of the invention are described in accompanied dependent claims.

Various non-limiting exemplifying embodiments of the invention both as to constructions and to methods of operation, together with additional objects and advantages thereof, will be best understood from the following description of specific exemplifying embodiments when read in connection with the accompanying drawings.

The verbs "to comprise" and "to include" are used in this document as open limitations that neither exclude nor require the existence of unrecited features. The features recited in depending claims are mutually freely combinable unless otherwise explicitly stated.

BRIEF DESCRIPTION OF THE FIGURES

The exemplifying embodiments of the invention and their advantages are explained in greater detail below in the sense of examples and with reference to the accompanying drawings, in which.

DESCRIPTION OF THE EXEMPLIFYING EMBODIMENTS

Figure 1A:
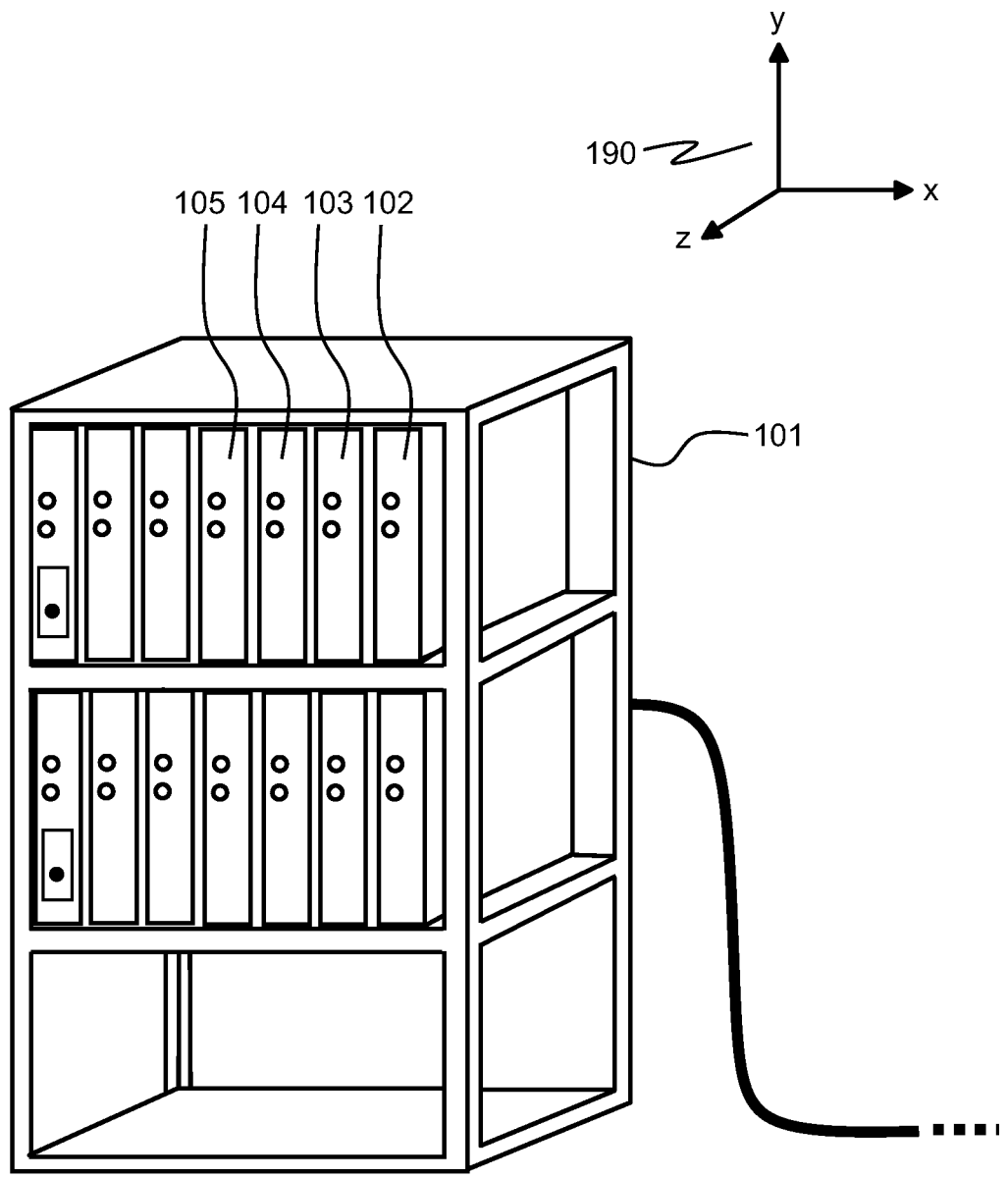
FIG. 1a shows a perspective view of equipment according to an exemplifying embodiment of the invention.

FIG. 1a shows a perspective view of equipment according to an exemplifying embodiment of the invention. The equipment can be, for example but not necessarily, telecommunication equipment such as an internet protocol "IP" router, an Ethernet switch, and Asynchronous Transfer Mode "ATM" switch, and/or a multiprotocol label switching "MPLS" switch. The equipment comprises a body device 101 and plug-in units installed in the body device. Some of the plug-in units are designated by reference numbers 102, 103, 104, and 105. In the exemplifying case shown in FIG. 1a, the body device is a frame comprising plug-in unit slots in which the plug-in units can be installed by pushing each plug-in unit in the negative z-direction of the coordinate system 190. The frame may comprise, for example, wirings such that the plug-in units installed in the frame form a full mesh network or such that the plug-in units installed in the frame are connected to a central element of the equipment which may comprise one or more plug-in units installed in the frame or which may be a functional component integrally built in the frame. The wirings are typically located on the backplane of the frame. It is also possible that a body device represents a bigger part of equipment than just a frame which interconnects and possibly controls the plug-in units. The equipment can be, for example, monitoring and alarming equipment comprising for example a camera, a motion sensor, and/or a transceiver each of which can be a plug-in unit or an integral part of the body-device of the equipment.

Figure 1B:
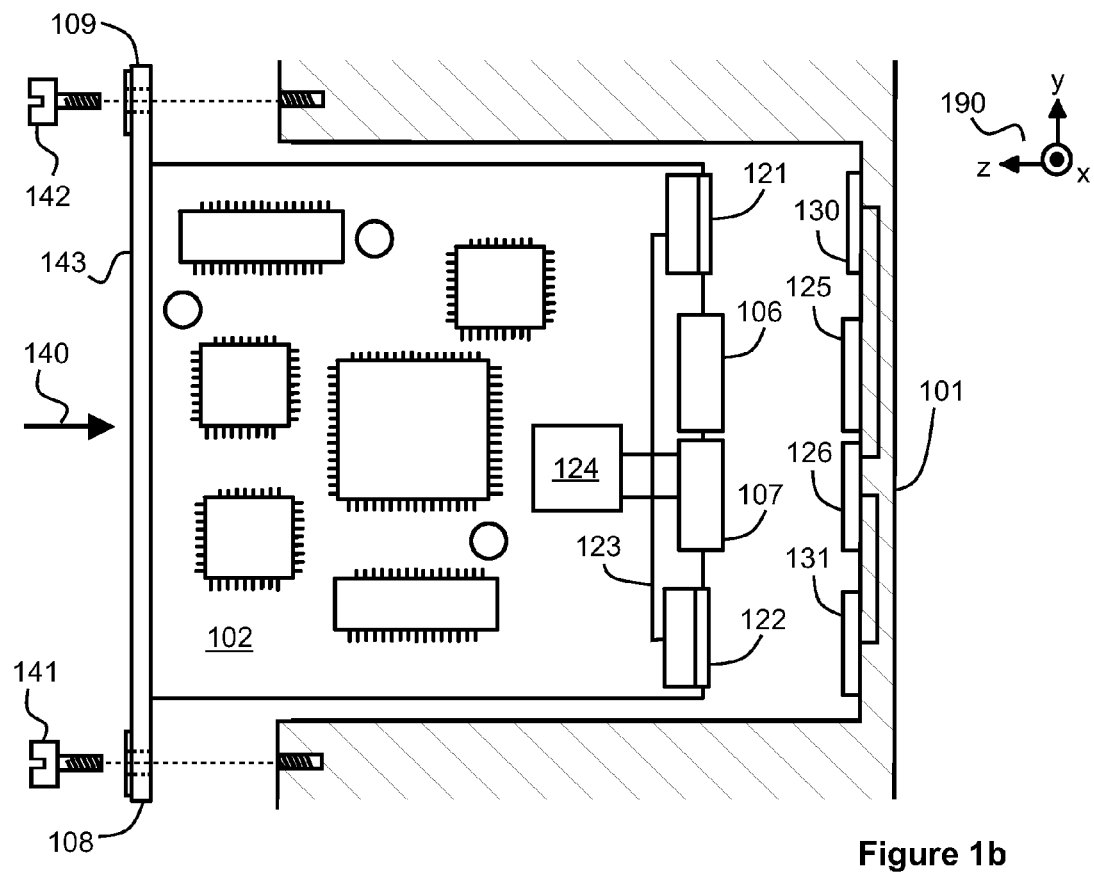
FIGS. 1b and 1c illustrate a plug-unit and a part of a body device of the equipment shown in FIG. 1a, FIG. 1d is a schematic illustration of a detail shown in FIG. 1c.
Figure 1C:
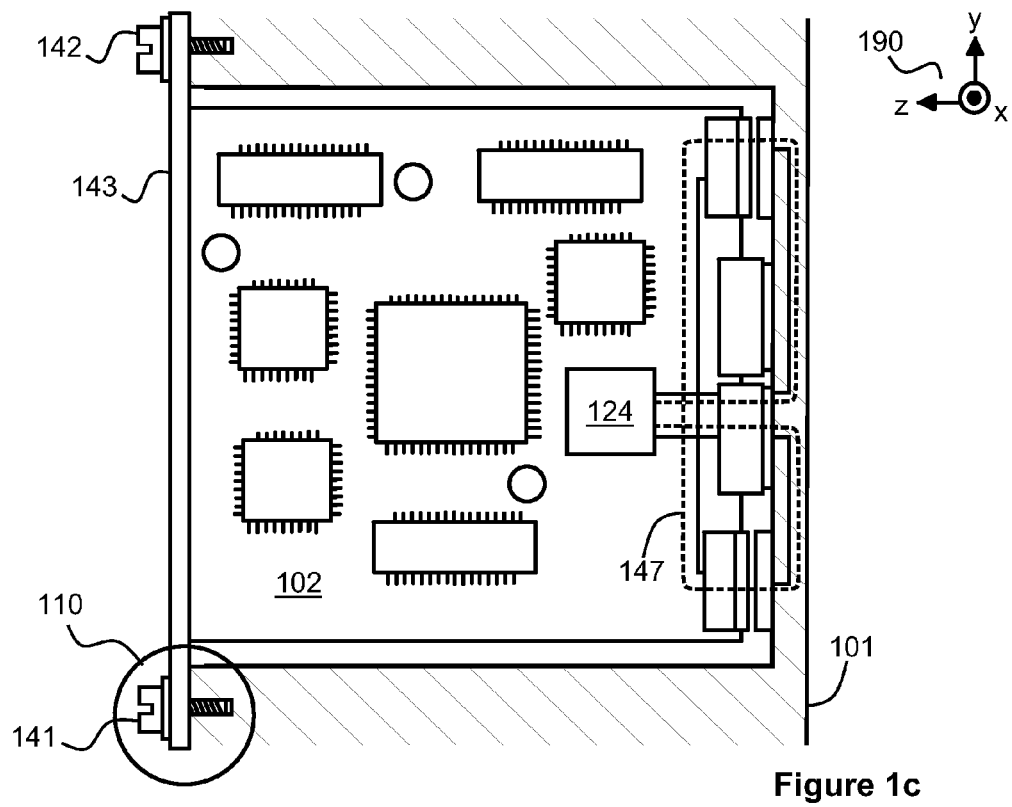

FIGS. 1b and 1c illustrate the plug-unit 102 of the equipment shown in FIG. 1a and a part of the body device 101 of the equipment. The plug-in 102 unit may comprise a processing system for handling data communications. The processing system may be configured to support the functionality of, for example: an Internet Protocol "IP" router, an Asynchronous Transfer Mode "ATM" switch, an Ethernet switch, and/or a MultiProtocol Label Switching "MPLS" switch. The plug-in unit 102 may also be, for example, a power supply unit or and/a control unit in which case it might not include a processing system to handle data communications.

The equipment comprises electrical connectors 106 and 107 in the plug-in unit 102, and corresponding electrical connectors 125 and 126 in the body device 101. These electrical connectors form galvanic contacts between the plug-in unit 102 and the body device 101 when the plug-in unit is inserted in the body device along the direction of an arrow 140 shown in FIG. 1a. The plug-in unit 102 comprises an electrically conductive structure having surface areas capable of forming capacitive couplings with the body device 101. The electrically conductive structure is illustrated in FIGS. 1b and 1c and it comprises pieces 121 and 122 which comprise electrical conductor at least on their surfaces facing towards the negative z-direction of the coordinate system 190. The electrically conductive structure further comprises an electrical conductor wire 123 which provides a galvanic connection between the electrical conductors of the pieces 121 and 122. When the plug-in unit 102 is in its operating position, the surface areas of the electrically conductive structure form a first capacitive coupling with a surface area of a first electrically conductive part 130 of the body device 101 and a second capacitive coupling with a surface area of a second electrically conductive part 131 of the body device. The body device comprises electrical conductors which connect the first and second electrically conductive parts 130 and 131 to first and second poles of the electrical connector 126 of the body device, respectively. The first and second poles of the electrical connector 126 are capable of forming galvanic contacts with the corresponding first and second poles of the electrical connector 107 of the plug-in unit. A dashed line 147 shown in FIG. 1c illustrates a measurement circuit comprising the above-mentioned first and second capacitive couplings and the galvanic contacts provided by the electrical connectors 107 and 126. When the distance from the piece 121 to the first electrically conductive part 130 and from the piece 122 to the second electrically conductive part 131 is increased, the first and second capacitive couplings weaken and thus the impedance of the measurement circuit increases. Hence, the above-mentioned distance can be indicated by measuring the electrical properties of the measurement circuit. In the exemplifying case illustrated in FIGS. 1b and 1c, the plug-in unit 102 comprises a first monitoring circuit 124 for generating a first signal indicative of the electrical properties of the measurement circuit. The first monitoring circuit 124 may comprise, for example, a test voltage generator for producing alternating text voltage and a measurement bridge that is connected to the measurement circuit and comprises a reference circuit adapted to simulate the electrical properties of the measurement circuit corresponding to the case in which the plug-in unit 102 is correctly installed.

It is to be noted that the measurement circuit does not necessarily comprise two capacitive couplings between the plug-in unit 102 and the body device 101. It is also possible that the first monitoring circuit 124 is connected with a first electrical conductor to a pole of the electrical connector 107 and with a second electrical conductor to the piece 121, and the electrically conductive part 130 of the body device is connected with an electrical conductor to the respective pole of the electrical connector 126. In this case, the measurement circuit comprises only one capacitive coupling between the plug-in unit 102 and the body device 101. On the other hand, it is possible to arrange the measurement circuit to comprise more than two capacitive couplings between the plug-in unit 102 and the body device 101.

In equipment according to an exemplifying embodiment of the invention, the plug-in unit 102 further comprises mechanical structures 108 and 109 enabling the plug-in unit to be locked in its operating position with respect to the body device with the aid of fastening elements 141 and 142 as illustrated in FIG. 1c. In the exemplifying case illustrated in FIGS. 1b and 1c, the fastening elements 141 and 142 are fastening screws and the above-mentioned mechanical structures are cantilevers protruding into directions perpendicular to the direction in which the plug-in unit is to be inserted in the body device. These cantilevers are formed by a front-plate 143 of the plug-in unit. Each cantilever comprises a through hole, a slot, or other suitable mechanical configuration enabling the plug-in unit to be locked in its operating position with respect to the body device with the fastening screw so that a part of the cantilever is between the screw-head and a wall of the body device as illustrated in FIG. 1c. As illustrated in FIGS. 1b and 1c, the body device 101 comprises threaded holes for receiving the fastening screws.

Figure 1D:
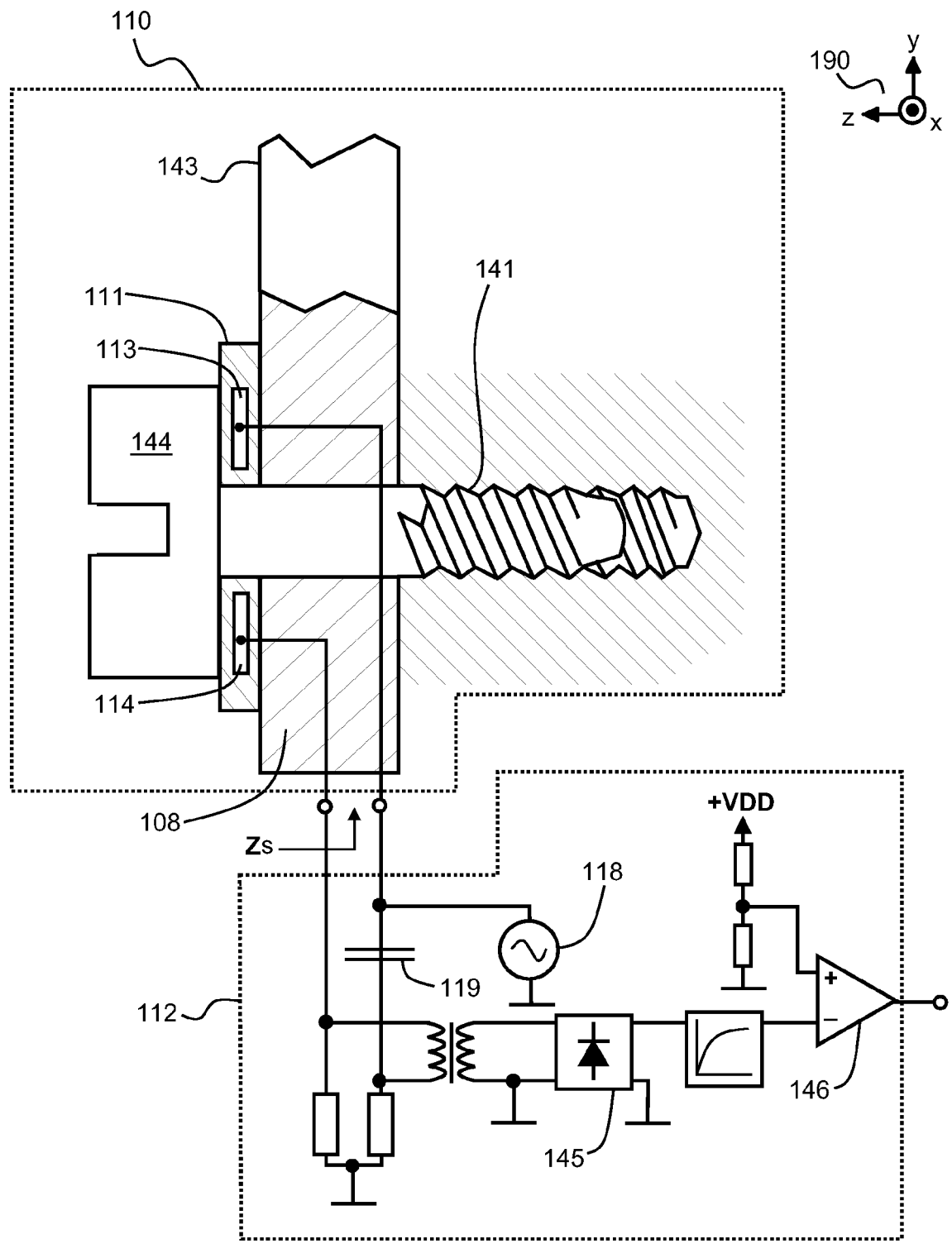

FIG. 1d shows a partial section view of a detail 110 shown in FIG. 1c. The plug-in unit comprises a sensor circuit 111 which has first electrical properties when the fastening element 141 is in the position locking the plug-in unit in its operating position and otherwise electrical properties differing from the first electrical properties. In the exemplifying embodiment of the invention illustrated in FIGS. 1b-1d, the sensor circuit 111 comprises electrical conductor elements 113 and 114 which have surfaces facing towards the head 144 of the fastening element 141 when the fastening element 141 is in the position locking the plug-in unit in the operating position. The electrical conductor elements 113 and 114 are capable of forming capacitive couplings with the head 144 when the fastening element is in the position locking the plug-in unit in the operating position. The electrical conductor elements are coated with electrically insulating material for providing galvanic isolation between the electrical conductor elements and the head 144. The sensor circuit 111 can be, for example, a sticker that comprises sheets of electrical conductors between sheets of electrical insulator. The sheets of electrical conductor constitute electrical conductor elements 113 and 114. The sticker has advantageously a through hole for the fastening element 141 and it can be attached to the front-plate 143 of the plug-in unit. 102 as illustrated in FIG. 1d.

In the exemplifying case illustrated in FIGS. 1a-1d, the equipment comprises a second monitoring circuit 112 shown in FIG. 1d. The second monitoring circuit 112 is configured to generate a second signal indicative of a difference between the prevailing electrical properties of the sensor circuit 111 and the first electrical properties which correspond to the case when the fastening element 141 is properly installed. This second signal is also indicative of the correctness of the installation of the plug-in unit in the body device. Furthermore, because it takes time to open the fastening element 141, a control system of the equipment can usually be informed well in advance about a removal of the plug-in unit 102. Thus, the control system can be given time to run down the plug-in unit in a controlled way before the removal.

In the exemplifying case shown in FIG. 1d, the second monitoring circuit 112 comprises a test voltage generator 118 for producing alternating test voltage. The second monitoring circuit 112 further comprises a measurement bridge connected to the sensor circuit 111 and comprising a reference circuit 119 adapted to simulate the first electrical properties, i.e. the electrical properties of the sensor circuit 111 when the fastening element 141 is in the position locking the plug-in unit in the operating position. The above-mentioned reference circuit 119 is a capacitor whose capacitance value has been chosen so that the impedance of the reference circuit is, at the frequency of the alternating test voltage, closer to the impedance Zs of the sensor circuit 111 when the fastening element 141 is in the position locking the plug-in unit in its operating position than when the fastening element is absent. If the impedance Zs of the sensor circuit 111 is the same as the impedance of the reference circuit 119, the measurement bridge illustrated in FIG. 1d is balanced and, as a corollary, the input voltage of a rectifier 145 is substantially zero and thereby the output voltage of the comparator 146 is down. A reference voltage for the comparator 146 is formed by voltage division from direct "DC" supply voltage +VDD as illustrated by FIG. 1d. The output voltage of the comparator 146 represents the above-mentioned second signal indicative of the correctness of the installation of the plug-in unit. When being down, the output voltage of the comparator indicates that the fastening element 141 is correctly installed. The fastening element 141 is assumed to comprise electrically conductive material so that its head 144 is capable of constituting a part of an electrical circuit.

Figure 2:
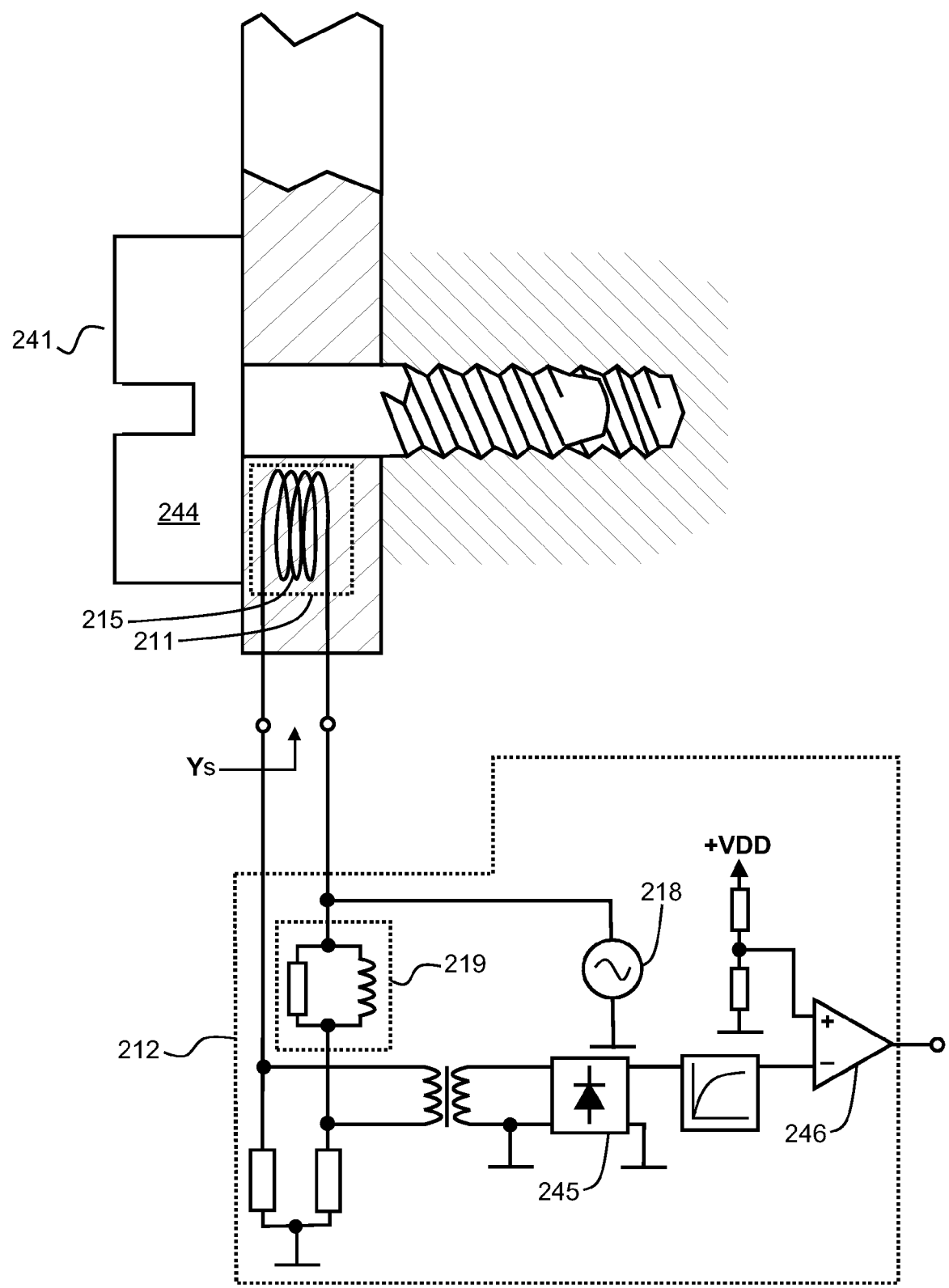
FIG. 2 is a schematic illustration of a detail of equipment according to an exemplifying embodiment of the invention.

FIG. 2 shows a schematic illustration of a detail of equipment according to an exemplifying embodiment of the invention. FIG. 2 corresponds to FIG. 1d otherwise except that a sensor circuit 211 and a second monitoring circuit 212 shown in FIG. 2 are different from those presented in FIG. 1d. The sensor circuit 211 comprises an inductor coil 215 and electrical conductors for supplying current to the inductor coil. The inductor coil is capable of causing an alternating magnetic field to a head 244 of a fastening element 241 when the fastening element is in the position locking the plug-in unit in the operating position and when alternating current is directed to the inductor coil. In the exemplifying case illustrated in FIG. 2, the fastening element 241 is a fastening screw that is assumed to comprise electrically conductive material so that eddy currents can form in a head 244 of the fastening element and possibly also in some other regions of the fastening element 241. The eddy currents mean that the real part of the admittance Ys of the sensor circuit 211 increases, the admittance being 1/impedance. Furthermore, the fastening element 241 may be made of ferromagnetic material which means that the presence of the fastening element increases also the inductance of the sensor circuit, i.e. the absolute value of the imaginary part of the admittance Ys decreases.

In the exemplifying case illustrated in FIG. 2, the second monitoring circuit 212 comprises a test voltage generator 218 for producing alternating test voltage and a measurement bridge connected to the sensor circuit 211 and comprising a reference circuit 219 adapted to simulate the electrical properties of the sensor circuit 211 when the fastening element 241 is in the position locking the plug-in unit in the operating position. The reference circuit 219 is a parallel connection of an inductor coil and a resistor which simulate, at the frequency of the alternating test voltage, the real and imaginary parts of the admittance Ys of the sensor circuit 211 corresponding to the case where the fastening element 241 is properly installed. If the admittance Ys of the sensor circuit 211 is the same as the admittance of the reference circuit 219, the measurement bridge illustrated in FIG. 2 is balanced and, as a corollary, the input voltage of a rectifier 245 is substantially zero and thereby the output voltage of the comparator 246 is down.

Figure 3:
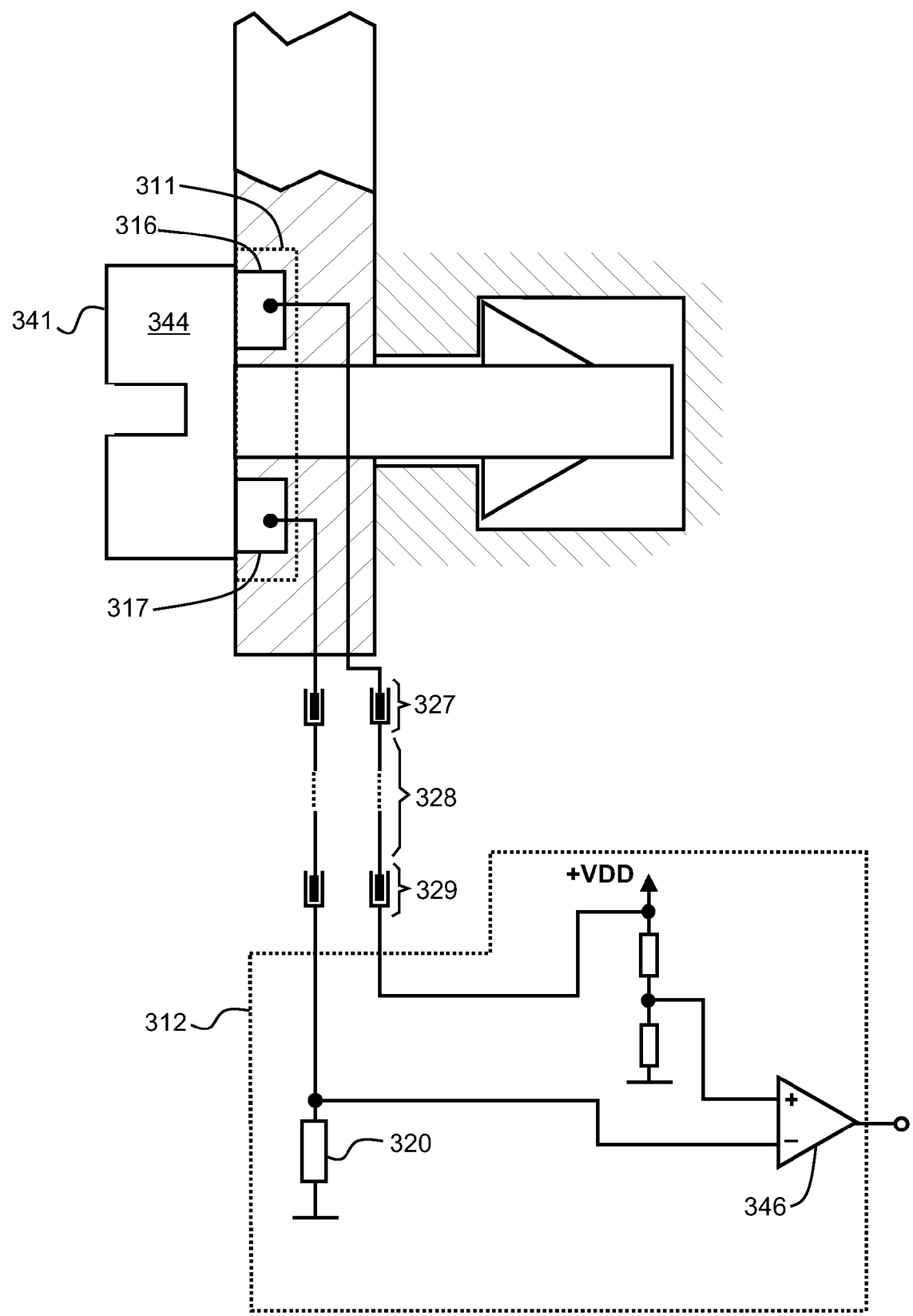
FIG. 3 is a schematic illustration of a detail of equipment according to an exemplifying embodiment of the invention.

FIG. 3 shows a schematic illustration of a detail of equipment according to an exemplifying embodiment of the invention. FIG. 3 corresponds to FIG. 1d otherwise except that a sensor circuit 311 and a second monitoring circuit 312 shown in FIG. 3 are different from those presented in FIG. 1d. The sensor circuit 311 comprises electrical conductor elements 316 and 317 and electrical conductors for supplying current to the electrical conductor elements. The electrical conductor elements are capable of forming galvanic contacts with a head 344 of a fastening element 341 when the fastening element is in the position locking the plug-in unit in the operating position. The fastening element 341 is assumed to comprise electrically conductive material so that it can provide a galvanic connection between the electrical conductor elements 316 and 317. In this case, the fastening element 341 is a bolt that comprises cantilevers for locking the plug-in unit in its operating position as illustrated in FIG. 3.

As illustrated by FIG. 3, the fastening element 141 is not necessarily a screw. Furthermore, the fastening element can be for example a locking pin, a cotter bolt, or any other mechanical element that is suitable for locking the plug-in unit in its operating position and capable of influencing the electrical properties of the sensor circuit.

In the exemplifying case illustrated in FIG. 3, the second monitoring circuit 312 comprises a measurement component 320 in series with the sensor circuit and a comparator 346 for producing a signal indicative of whether voltage of the measurement component 320 exceeds a reference voltage. The reference voltage is formed by voltage division from a direct "DC" supply voltage +VDD as illustrated by FIG. 3. When the fastening element 341 is in the position locking the plug-in unit in the operating position, the -head 344 provides the galvanic connection between the electrical conductor elements 316 and 317. Thus, the voltage of the measurement component 320 is up. As a corollary, output voltage of the comparator 346 is down.

It is to be noted that the second monitoring circuit 112, 212, or 312 is not necessarily located in the plug-in unit which comprises the corresponding sensor circuit. The second monitoring circuit can be located also in another plug-in unit or in the body device. FIG. 3, illustrates a case where the second monitoring circuit 312 is located in another plug-in unit than the one comprising the sensor circuit 311. In this case, the electrical connections between the sensor circuit 311 and the second monitoring circuit 312 are formed via poles 327 and 329 of electrical connectors between the body device and these plug-in units and via electrical conductors 328 of the wirings of the body device, e.g. a frame of telecommunication equipment.

Equipment according to an exemplifying embodiment of the invention comprises sensor circuits and second monitoring circuits for both of the fastening elements 141 and 142 shown in FIGS. 1b and 1c. The equipment may further comprise a logic circuit for generating, on the basis of output signals of the second monitoring circuits, a combined signal that indicates whether at least one of the fastening elements is incorrectly installed.

The correctness of the installation of the plug-in unit 102 shown in FIGS. 1a-1c can be indicated more reliably by utilizing the detection based on one or both of the fastening elements 141 and 142 together with the detection based on the measurement circuit illustrated with the dashed line 147 in FIG. 1c. If one or both of these detections indicate incorrect installation of the plug-in unit, the installation is preferably deemed to be incorrect. Monitoring arrangements of the kind described above can be, naturally, used also in conjunction with the other plug-in units of the equipment.

Equipment according to an exemplifying embodiment of the invention comprises a controller configured to generate an aggregate signal indicating incorrect installation of the plug-in unit 102 when at least one of the following takes place: (i) there is a first signal indicating that the electrical properties of the measurement circuit, e.g. the dashed line 147 in FIG. 1c, differ from the electrical properties corresponding to correct installation of the plug-in unit 102, (ii) there is a second signal indicating that installation of any of the fastening elements 141 and 142 is incorrect. The controlled can be located, for example, in one of the plug-in units or in the body device. Monitoring arrangements of the kind described above can be, naturally, used also in conjunction with the other plug-in units of the equipment.

Figure 4:
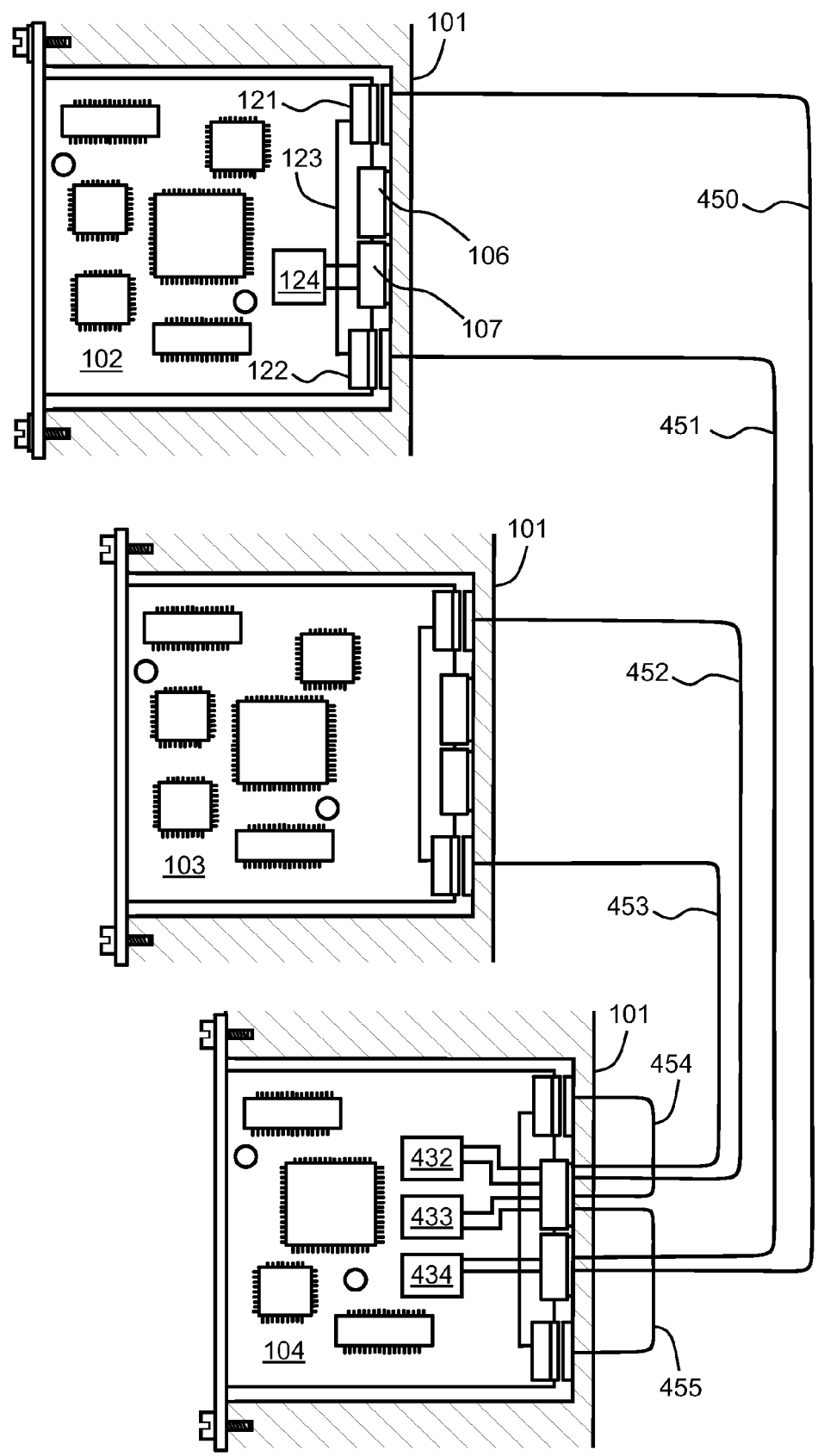
FIG. 4 is a schematic illustration of an exemplifying configuration of the equipment shown in FIG. 1a, and FIG. 5 shows a flowchart of a method according to an exemplifying embodiment of the invention for indicating correct installation of a plug-in unit.

FIG. 4 illustrates an exemplifying configuration of the equipment shown in FIG. 1a. In this configuration, the plug-in unit 104 is a control plug-in unit which comprises monitoring circuits 432, 433, and 434. Each of these monitoring circuits 432-434 is related to a corresponding one of the plug-in units of the equipment and configured to monitor electrical properties of a measurement circuit comprising capacitive couplings between the body device 101 and the corresponding one of the plug-in units and galvanic contacts between the body device and the control plug-in unit. In the exemplifying case shown in FIG. 4, the monitoring circuit 434 is related to the plug-in unit 102, the monitoring circuit 433 is related to the plug-in unit 104, i.e. to the control plug-in unit, and the monitoring circuit 432 is related to the plug-in unit 103. In the exemplifying case shown in FIG. 4, the wiring of the body device comprises electrical conductors 450, 451, 452, 453, 454, and 455. For example, electrical conductors 450 and 451 belongs a measurement circuit which comprises the capacitive couplings between the body device 101 and the plug-in unit 102 and which is monitored with the monitoring circuit 434. In the above-described configuration, the plug-in unit 104, i.e. the control plug-in unit, can be made aware of the installation of itself and of installations of the other plug-in units.

Figure 5:
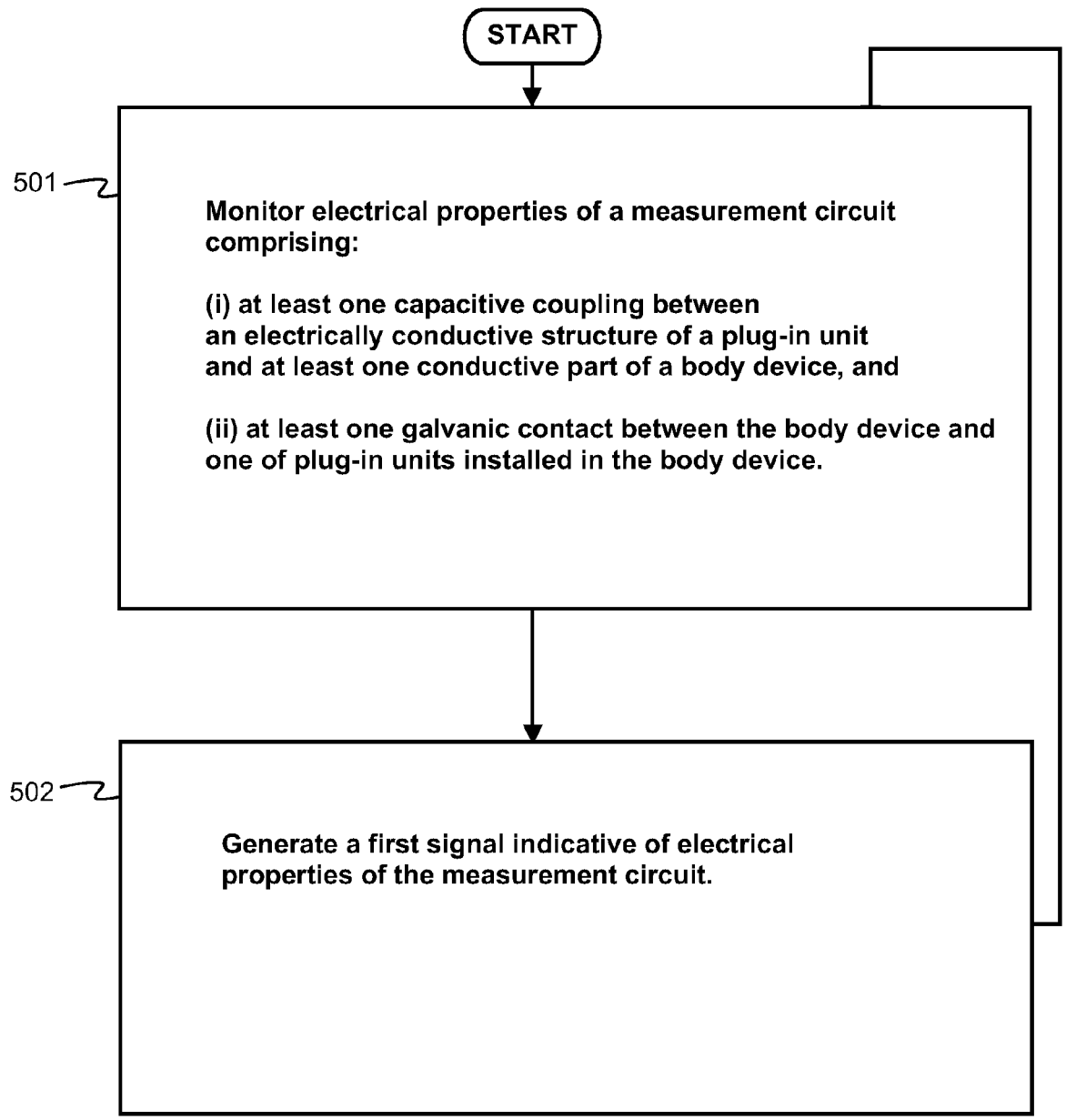

FIG. 5 shows a flowchart of a method according to an exemplifying embodiment of the invention for indicating correct installation of a first plug-in unit in a body device. The method comprises the following actions:

action 501: monitoring electrical properties of a measurement circuit comprising: (i) at least one capacitive coupling between an electrically conductive structure of the first plug-in unit and at least one conductive part of the body device, and (ii) at least one galvanic contact between the body device and one of the following: the first plug-in unit, a second plug-in unit installed in the body device, action 502: generating a first signal indicative of electrical properties of the measurement circuit, the first signal being also indicative of correctness of the installation of the first plug-in unit.

A method according to an exemplifying embodiment of the invention further comprises:

monitoring electrical properties of a sensor circuit which has first electrical properties when a fastening element is in a position locking the first plug-in unit in its operating position with respect to the body device and otherwise electrical properties differing from the first electrical properties, and generating a second signal indicative of a difference between the prevailing electrical properties of the sensor circuit and the first electrical properties, the second signal being also indicative of correctness of the installation of the first plug-in unit.

The fastening element can be, for example, a fastening screw, a locking pin, or a cotter bolt. In general, the fastening element can be any mechanical element that is suitable for locking the plug-in unit in its operating position and capable of influencing the electrical properties of the sensor circuit.

A method according to an exemplifying embodiment of the invention further comprises generating an aggregate signal indicating incorrect installation of the first plug-in unit in response to at least one of the following:
   the first signal indicates that the electrical properties of the measurement circuit differ from electrical properties corresponding to a correct installation,
   the second signal indicates that the electrical properties of the sensor circuit differ from the first electrical properties.

The specific examples provided in the description given above should not be construed as limiting the applicability and/or the interpretation of the appended claims.

What is claimed is:

1. An equipment comprising:
   one or more plug-in units involving a first plug-in unit,
   a body device for receiving the one or more plug-in units, and
   electrical connectors in the one or more plug-in units and in the body device, the electrical connectors being suitable for providing galvanic contacts between each of the one or more plug-in units and the body device,
   wherein:
   at least the first plug-in unit comprises an electrically conductive structure having at least one surface area capable of forming a capacitive coupling with a surface area of an electrically conductive part of the body device when the first plug-in unit is inserted in the body device, and
   the equipment further comprises a first monitoring circuit for generating a first signal indicative of electrical properties of a measurement circuit comprising the capacitive coupling and at least one galvanic contact provided by the electrical connectors.

2. The equipment according to claim 1, wherein the first monitoring circuit is located in the first plug-in unit, and the at least one galvanic contact of the measurement circuit is between the first plug-in unit and the body device.

3. The equipment according to claim 1, wherein the first monitoring circuit is located in a second plug-in unit that is one of the plug-in units of the equipment and other than the first plug-in unit, and the at least one galvanic contact of the measurement circuit is between the second plug-in unit and the body device.

4. The equipment according to claim 1, wherein the first monitoring circuit is located in the body device, and the at least one galvanic contact of the measurement circuit is between the first plug-in unit and the body device.

5. The equipment according to claim 1, wherein the first monitoring circuit comprises a test voltage generator for producing alternating test voltage and a measurement bridge connected to the measurement circuit and comprising a reference circuit adapted to simulate the electrical properties of the measurement circuit corresponding to a correct installation of the first plug-in unit.

6. The equipment according to claim 1, wherein one of the plug-in units of the equipment is a control plug-in unit which comprises one or more monitoring circuits each of which being related to a corresponding one of the plug-in units of the equipment and configured to monitor electrical properties of a circuit comprising:
   at least one capacitive coupling between the body device and the corresponding one of the plug-in units of the equipment, and
   galvanic contacts between the body device and the control plug-in unit.

7. The equipment according to claim 1, wherein:
   the first plug-in unit comprises at least one mechanical structure enabling the first plug-in unit to be locked in its operating position with respect to the body device with a fastening element,
   the first plug-in unit comprises a sensor circuit having first electrical properties when the fastening element is in a position locking the first plug-in unit in the operating position and otherwise electrical properties differing from the first electrical properties, and
   the equipment comprises a second monitoring circuit for generating a second signal indicative of a difference between the prevailing electrical properties of the sensor circuit and the first electrical properties.

8. The equipment according to claim 7, wherein the second monitoring circuit is located in the first plug-in unit.

9. The equipment according to claim 7, wherein the second monitoring circuit is located in a third plug-in unit that is one of the plug-in units of the equipment and other than the first plug-in unit, the sensor circuit and the second monitoring circuit being electrically connectable via the electrical connectors.

10. The equipment according to claim 7, wherein the second monitoring circuit is located in the body device, the sensor circuit and the second monitoring circuit being electrically connectable via the electrical connectors.

11. The equipment according to claim 7, wherein the sensor circuit comprises electrical conductor elements capable of forming capacitive couplings with the fastening element when the fastening element is in the position locking the plug-in unit in the operating position, the electrical conductor elements being coated with electrically insulating material for providing galvanic isolation between the electrical conductor elements and the fastening element.

12. The equipment according to claim 7, wherein the sensor circuit comprises an inductor coil capable of causing an alternating magnetic field to the fastening element when the fastening element is in the position locking the plug-in unit in the operating position and when alternating current is directed to the inductor coil.

13. The equipment according to claim 7, wherein the sensor circuit comprises electrical conductor elements capable of forming galvanic contacts with the fastening element when the fastening element is in the position locking the plug-in unit in the operating position.

14. The equipment according to claim 7, wherein the second monitoring circuit comprises a test voltage generator for producing alternating test voltage and a measurement bridge connected to the sensor circuit and comprising a reference circuit adapted to simulate the first electrical properties.

15. The equipment according to claim 7, wherein the body device comprises a threaded hole for receiving a fastening screw for locking the first plug-in unit in the operating position, the fastening screw representing the fastening element.

16. The equipment according to claim 7, wherein the equipment comprises a controller configured to generate an aggregate signal indicating incorrect installation of the first plug-in unit in response to at least one of the following:
   the first signal indicates that the electrical properties of the measurement circuit differ from electrical properties corresponding to a correct installation,
   the second signal indicates that the electrical properties of the sensor circuit differ from the first electrical properties.

17. The equipment according to claim 1, wherein the equipment is at least one of the following: an internet protocol "IP" router, an Ethernet switch, a MultiProtocol Label Switching "MPLS" switch, an Asynchronous Transfer Mode "ATM" switch.

18. A method for indicating correct installation of a first plug-in unit in a body device, the method comprising monitoring electrical properties of a measurement circuit comprising:
- at least one capacitive coupling between an electrically conductive structure of the first plug-in unit and at least one conductive part of the body device, and
- at least one galvanic contact between the body device and one of the following: the first plug-in unit, a second plug-in unit installed in the body device,
- wherein the method further comprises generating a first signal indicative of the electrical properties of the measurement circuit, the first signal being also indicative of correctness of the installation of the first plug-in unit.

19. The method according claim 18, wherein the method further comprises:
- monitoring electrical properties of a sensor circuit which has first electrical properties when a fastening element is in a position locking the first plug-in unit in its operating position with respect to the body device and otherwise electrical properties differing from the first electrical properties, and
- generating a second signal indicative of a difference between the prevailing electrical properties of the sensor circuit and the first electrical properties, the second signal being also indicative of correctness of the installation of the first plug-in unit.

20. The method according claim 19, wherein the method comprises generating an aggregate signal indicating incorrect installation of the first plug-in unit in response to at least one of the following:
- the first signal indicates that the electrical properties of the measurement circuit differ from electrical properties corresponding to a correct installation,
- the second signal indicates that the electrical properties of the sensor circuit differ from the first electrical properties.

* * * * *